United States Patent [19]

Takahashi

[11] Patent Number: 4,771,202
[45] Date of Patent: Sep. 13, 1988

[54] TUNING FORK RESONATOR

[75] Inventor: Kunihiro Takahashi, Tokyo, Japan

[73] Assignee: Kabushiki Kaisha Daini Seikosha, Tokyo, Japan

[21] Appl. No.: 485,629

[22] Filed: Apr. 18, 1983

[30] Foreign Application Priority Data

Apr. 20, 1982 [JP] Japan .................................. 57-65703

[51] Int. Cl.⁴ ............................................ H01L 41/08
[52] U.S. Cl. .................................. 310/312; 310/366; 310/370
[58] Field of Search .................... 310/370, 366, 312

[56] References Cited

U.S. PATENT DOCUMENTS 4,320,320 3/1982 Momosaki et al. ............. 310/370 X
4,377,765 3/1982 Kogure et al. .................. 310/370 X Primary Examiner—Mark O. Budd
Attorney, Agent, or Firm—Bruce L. Adams; Van C. Wilks

[57] ABSTRACT

A piezoelectric coupled mode turning fork using the fundamental vibration of a flexural mode coupled with the fundamental mode of torsion. The fundamental frequency of the torsional mode is adjusted by masses near the side edges of the tine tips, and the fundamental frequency of the flexural mode being adjusted by masses near the center of the tine tips which are nodes of the fundamental torsional mode.

19 Claims, 3 Drawing Sheets

TUNING FORK RESONATOR

BACKGROUND OF THE INVENTION

This invention relates to a tuning fork resonator using an elastic coupling between the fundamental vibration of a flexural mode and the fundamental vibration of a torsional mode, and more particularly to the positions of masses for adjusting frequencies of the two modes.

Recently, a tuning fork quartz resonator with improved frequency-temperature characteristic (referred to as f-T characteristic hereafter) using an elastic coupling between the flexural mode and the torsional mode has been proposed. This tuning fork quartz resonator has become popular since it may serve as a quartz resonator for wristwatches with high accuracy capable of indicating yearly rate of a comparatively low frequency.

To improve the f-T characteristic of the flexural mode using the elastic coupling of the two modes, the frequency difference (referred to as $\delta f$ hereafter) of the two modes should be set at a suitable value. When the length and width of the tuning fork arms are respectively l, w, and thickness of the resonator is t, the frequency of the flexural mode (referred to as $f_F$ hereafter) and the frequency of the torsional mode (referred to as $f_T$ hereafter) are respectively proportional to $w/l^2$ and $t/(lw)$. Therefore, to set $\delta f$ at a suitable value, the thickness t of the resonator should be set at a suitable value. Since, however, the amount of change in $f_T$ by the thickness t is extremely large, it is nearly impossible to set $\delta f$ at a suitable value only by varying the thickness t.

For that, the adjustment of the frequency difference $\delta f$ (referred to as $\delta f$ adjustment hereafter) has been attempted by the addition or reduction of masses on a tuning fork resonator. Frequency adjustment by addition or reduction of masses has two purposes; namely, one is the frequency adjustment by setting a frequency $f_F$ of the flexural mode, which is the main mode, at a desired value, the other is the frequency adjustment by adjusting the frequency difference $\delta f$ between the flexural mode and the torsional mode. In the latter case, it is desirable that the frequency of one mode scarcely changes while the other mode largely changes by the addition or reduction of the masses.

FIG. 1 shows a conventional embodiment of the positions of masses added or reduced at a tuning fork quartz resonator using an elastic coupling between a secondary flexural mode and a fundamental torsional mode. Numeral 11 denotes a tuning fork quartz resonator, 12 and 13 are masses added or reduced at the tips of the tuning fork arms, 14 and 15 denote masses added or reduced at the position l' which is spaced from the resonator crotch by 0.77 l when the length of the arms is l. x, y' and z' respectively denote the width, length and thickness directions of the resonator and also denote the directions of the electrical axis x, the mechanical axis y rotated around the x axis, and the optical axis z rotated around the x axis.

FIG. 2 shows the displacement in the x direction of the secondary flexural mode on line AB on the tuning fork arms in FIG. 1. When the length of the tuning fork arms is l, the displacement of the position l' away from the point A by about 0.77 l is zero. Accordingly, $f_T$ can be largely changed with scarcely changing $f_F$ by addition or reduction of the masses 14 and 15 in FIG. 1.

The length of the arms of the tuning fork quartz resonator using the coupling between the secondary flexural mode and the fundamental torsional mode should be, however, longer than that of the tuning fork quartz resonator using the coupling between the fundamental flexural mode and the fundamental torsional mode when the frequencies of each of the flexural modes are the same. Moreover, the thickness of the resonator should be larger to enable the elastic coupling between the flexural mode and the torsional mode. Accordingly, a method of using the elastic coupling between the secondary flexural mode and the fundamental torsional mode is disadvantageous in that the dimension of the resonator becomes larger and because it takes a comparatively long time to make the resonator by etching using photolithography and thus is not suitable for mass production.

SUMMARY OF INVENTION

Accordingly it is an object of the present invention to provide a tuning fork resonator using an elastic coupling between the fundamental flexural mode and the fundamental torsional mode whose $\delta f$ adjustment is easily carried out.

DESCRIPTION OF THE PREFERRED EMBODIMENTS

Figure 3:
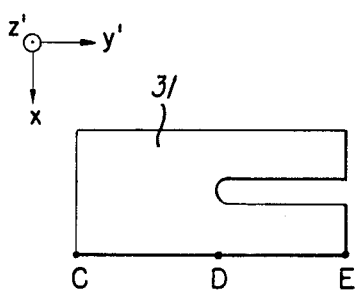
FIG. 3 is a plan view of a tuning fork flexural resonator.

FIG. 3 shows a plan view of a tuning fork quartz resonator using an elastic coupling between the fundamental flexural mode and the fundamental torsional mode. Numeral 31 shows a tuning fork quartz resonator whose x, y' and z' axes are defined similarly to those in FIG. 1.

Figure 4:
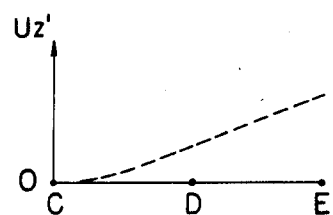
FIG. 4 is a graph showing the dimension of the thickness direction displacement of the torsional mode.
Figure 2:
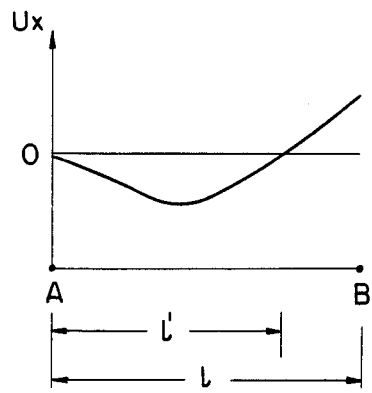
FIG. 2 is a graph showing the state of displacement of a secondary flexural mode.

FIG. 4 shows the thickness direction displacement uz' of the torsional mode on line CDE shown in FIG. 3. Uz' is the largest displacement out of the three displacement components of the torsional mode. FIG. 4 shows that the position on which $f_T$ most changes by addition or reduction of the masses is near the end tip of the tuning fork arm.

Figure 5:
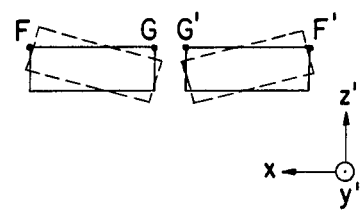
FIG. 5 is an explanatory diagram showing the state of displacement of the torsional mode on a section of the tuning fork arms.

FIG. 5 shows the state of displacement of the torsional mode at the section of the tips of the arms. A solid line indicates the sectional shape of the tips of the arms, and a broken line indicates the state of displacement of the torsional mode. FIG. 5 shows that uz' is large at the edges in the width direction of the arms, i.e. at the points F, G, G' and F', and uz' is small near the middle in the width direction. Therefore, the change in $f_T$ is expected to be larger at the edge in the width direction than at the middle in the width direction of the tuning fork arms by addition or reduction of an equal amount of the masses.

Figure 6:
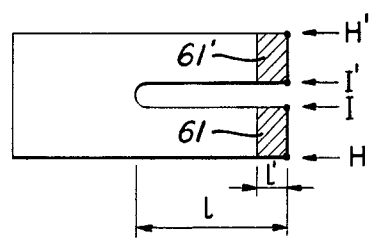
FIGS. 6 and 8 are plan views showing positions of adjustment masses added or reduced at a tuning fork quartz resonator.

FIG. 6 shows positions 61, 61' of the masses added to or reduced at the tuning fork quartz resonator using an elastic coupling between the fundamental flexural mode and the fundamental torsional mode. The position on which the masses are added or reduced at the arms l''=l/5, which is away from the tips of the tuning fork arms when the length of the arms is l.

Figure 7:
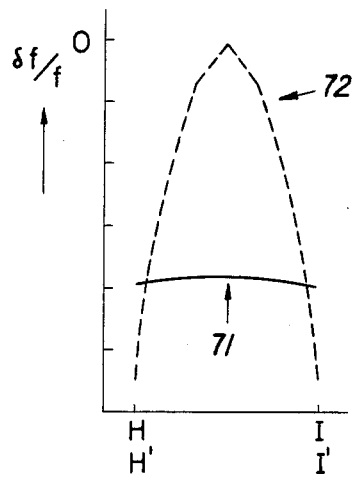
FIGS. 7 and 9 are graphs showing frequency changes in a flexural mode and a torsional mode in case masses are added to the positions shown in FIGS. 6 and 8.

FIG. 7 shows the amount of changes in $f_T$ and $f_F$ when the masses are deposited on l'' by evaporation or the like. In FIG. 7 the abscissa denotes the positions H, I, H' and I' in the x axis direction of the tips of the arms shown in FIG. 6. The ordinate denotes the frequency deviation $\delta f/f$ of $f_F$ and $f_T$. Numerals 71 and 72 respectively denote the amount of changes in $f_F$ and $f_T$. The amount of changes in $f_F$ and $f_T$ are calculated by the finite element method.

FIG. 7 clearly shows that the amount of changes in $f_F$ scarcely relates to the positions of the masses in the width direction of the arms, while that of $f_T$ scarcely changes by the masses at the middle but largely changes by the masses at both edges in the width direction of the arms.

Figure 1:
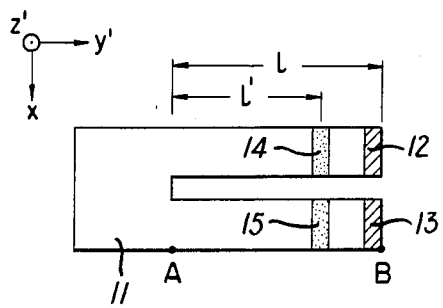
FIG. 1 is a plan view of a tuning fork quartz resonator showing conventional positions of the adjustment masses.
Figure 8:
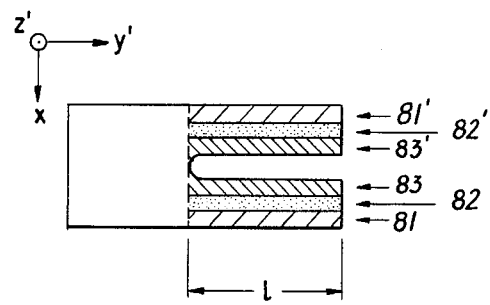

FIG. 8 shows a plan view of a turning fork quartz resonator using an elastic coupling between a fundamental flexural mode and a fundamental torsional mode. x, y' and z' are defined similarly to those in FIG. 1. The width direction of the tuning fork arms are is divided into three regions: 81 and 81', 82 and 82' and 83 and 83'.

Figure 9:
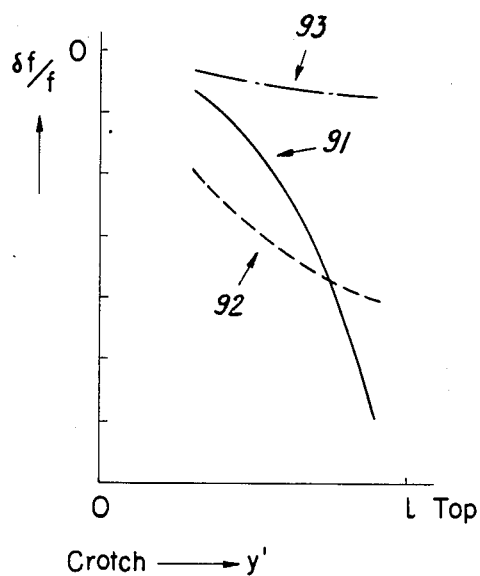

FIG. 9 shows the state in changes of $f_F$ and $f_T$ when masses are deposited on the three regions of the tuning fork arms along the length direction thereof. In FIG. 9, the abscissa indicates the length direction of the tuning fork arms, i.e. the positions in the y' direction in FIG. 8. The tips of the arms are at the position l and the crotch of the arms is at the position zero. The ordinate indicates the frequency deviation $\delta f/f$ of $f_F$ and $f_T$. The changes of $f_F$ and $f_T$ are also calculated by the finite element method in a similar manner to FIG. 7.

Numeral 91 denotes the deviation of $f_F$ in the three regions divided in the width direction of the arms shown in FIG. 8, which shows that changes in $f_F$ shows little difference in the three regions. Numeral 92 denotes the frequency deviation of $f_T$ when the masses are deposited at both edges in the width direction of the tuning fork means 81, 81' and 83, 83' shown in FIG. 8. Numeral 93 denotes the deviation of $f_T$ when the masses are deposited on the middle region in the width direction of the arms 82, 82' shown in FIG. 8.

FIG. 9 clearly shows that the positions of the masses on which the change in $f_T$ being at maximum are the edges in the width direction of the tips of the arms. While the position of the masses on which the frequency deviation ratio of $f_T$ and $f_F$ $(\delta f_T/f_T)/(\delta f_F/f_F)$ being at minimum is the middle in the width direction of the tips of the arms. In this invention, $f_T$ is adjusted by addition or reduction of the masses at the edges in the width direction of the tips of the arms, and $f_F$ is adjusted by addition or reduction of the masses at the middle in the width direction of the tips of the arms. By the former adjustment $f_T$ largely changes, and by the latter adjustment $f_F$ changes without changing $f_T$. Accordingly, the dispersion in $f_T$ by the dispersion in the thickness of the resonator is adjusted by the masses at the edges in the width direction of the tips of the arms, and simultaneously $f_F$ and the difference between $f_F$ and $f_T$ are adjusted to respective desired values by the masses at the middle in the width direction of the tips of the arms.

Figure 10:
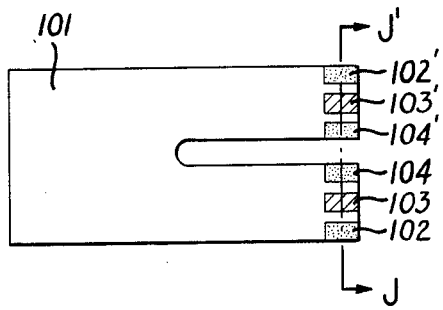
FIG. 10 is a plan view of a tuning fork quartz resonator showing an embodiment of the present invention.

FIG. 10 is a plan view of a tuning fork quartz resonator showing an embodiment of the present invention. Numeral 101 denotes a tuning fork quartz resonator, 102, 102', 104 and 104' denote positions of adjustment masses to be added or reduced for adjusting $f_T$, and 103 and 103' denote positions of adjustment masses to be added or reduced for simultaneously adjusting $\delta f$ and $f_F$.

Figure 11:
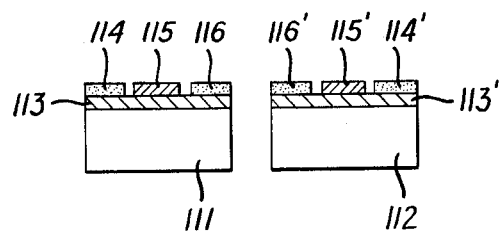
FIGS. 11 and 12 are sections taken on line JJ' in FIG. 10, FIGS. 13 and 14 are plan views showing other embodiments of the present invention respectively.

FIG. 11 is a section of the tips of the arms taken on line JJ' shown in FIG. 10. Numerals 111 and 112 are arms of the quartz crystal, and 113 and 113' are mass bases made of Cr, Au or the like. Numerals 114, 114', 116 and 116' are masses added or reduced for adjusting $f_T$, and 115 and 115' are masses added or reduced for adjusting $f_F$ and $\delta f$.

Figure 12:
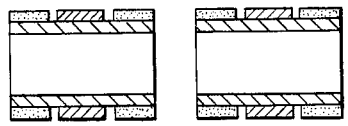

FIG. 12 shows a section of the tips of the arms taken on line JJ' shown in FIG. 10 as well. FIG. 12 is different from FIG. 11 in that the masses added or reduced are at both major surfaces of the tips of the arms. The masses added or reduced at the edges and the middle in the width direction of the tuning fork arms serve identically to those aforedescribe in the case of FIG. 11.

Both the embodiments of the present invention in FIGS. 11 and 12 show that the main portions of the adjustment masses added or reduced on the mass bases are deposited separately at the edge regions and the middle region in the width direction of the arms. By this, the positioning of the masses can be precisely made both in adding the masses by evaporation, etc. and reducing the masses by laser, etc., whereby the adjustments of $f_F$ and $f_T$ are easily carried out.

Figure 13:
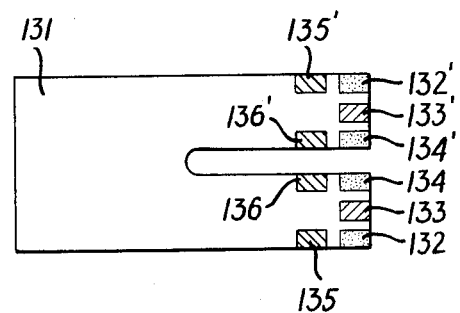

FIG. 13 is a plan view showing another embodiment of the present invention. Numeral 131 denotes a tuning fork quartz resonator, 132, 132', 134 and 134' are masses added or reduced at edges in the width direction of the tips of the arms, and 133 an 133' are masses added or reduced at the middle in the width direction of the tips of the arms. Masses added or reduced at positions 135, 135', 136 and 136' have the property capable of changing $f_F$ and $f_T$ without changing the f-T characteristic since the frequency deviation of $f_F$ and $f_T$ are almost the same as shown in FIG. 9. Accordingly, in case $f_F$ is not set at the desired value although the f-T characteristic is improved by addition or reduction of the masses at the tips of the arms, $f_F$ can be set at the desired value without changing the f-T characteristics by addition or reduction of the masses at the positions 135, 135', 136 and 136'.

Figure 14:
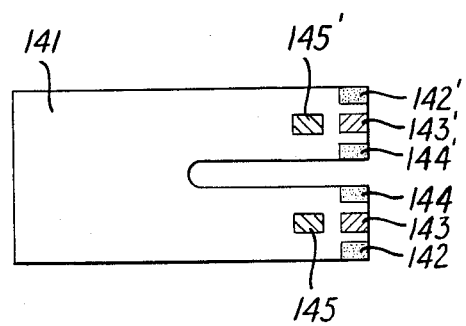

FIG. 14 is a plan view showing another embodiment of the present invention. Numeral 141 is a quartz resonator, 142, 142', 144 and 144' are masses added or reduced at the edges in the width direction of the tips of the arms, and 143 and 143' are masses added or reduced at the middle in the width direction of the tips of the arms. $f_T$ scarely changes while $f_F$ largely changes by addition or reduction of the masses at the positions 145 and 145'. Accordingly, in the case $f_F$ cannot be adjusted at the desired value by the addition or reduction of masses at the tips of the arms, the masses added or reduced at 145 and 145' can be used to set $f_F$ at the desired value.

It is to be noted that although the above embodiments have been illustrated taking a quartz resonator as the exemplary resonator, the material for the resonator is not restricted to quartz crystal since the above discussion may be applied to resonators made of other materials.

As illustrated in detail, a tuning fork resonator using an elastic coupling between the fundamental flexural mode and the fundamental torsional mode according to the present invention has an outstanding feature that enables the δf adjustment, whereby the f-T characteristic of the flexural mode with high mass-productivity is realized. Moreover the present invention reduces the dimension of a tuning fork resonator since the fundamental flexural mode is used as the main mode, whereby the resonator is suitable for mass production when it is made by photolithography as a quartz resonator because the thickness thereof is small.

I claim:

1. A tuning fork resonator assembly comprising: a tuning fork resonator using a coupling between the fundamental vibration of a flexural mode which is the main mode and the fundamental vibration of a torsional mode which is a sub-mode, at least three separate masses disposed along a line in the width direction of the tuning fork arms at the tips thereof, the fundamental frequency of the torsional mode being adjustably set by addition or reduction of the masses which are disposed at the edges of said line in the width direction, and the frequency-temperature characteristic of the flexural mode being adjustably set by addition or reduction of the masses which are disposed at the middle of said line in the width direction which are the nodal points of the fundamental torsional mode.

2. A tuning fork resonator assembly as claimed in claim 1; wherein said resonator comprises a quartz crystal resonator.

3. A tuning fork resonator assembly as claimed in claim 1; including masses disposed at other positions on the tuning fork arms.

4. A tuning fork resonator assembly as claimed in claim 3; wherein the said other positions on the tuning fork arms comprise positions near the edges in the width direction of the tuning fork arms at which the frequency deviations of the flexural mode being the main mode and of the torsional mode being the sub-mode are almost equal.

5. A tuning fork resonator assembly as claimed in claim 3; wherein the said other positions on the tuning fork arms comprises positions on the middle in the width direction of the tuning fork arms which are the nodal points of the fundamental vibration of the torsional mode.

6. A tuning fork resonator assembly comprising: a tuning fork body having vibratable tuning fork arms extending outwardly therefrom and having at least two coupled together vibrational modes including a main-mode fundamental flexural mode of vibration and a sub-mode fundamental torsional mode of vibration, each tuning fork arm having a pair of opposed major surfaces and having a fixed end fixed to the tuning fork body and a free end; a first set of separate masses disposed on at least one major surface of the free ends of the tuning fork arms at the inner and outer edge portions thereof and having a mass value effective to set the vibrational frequency of the fundamental torsional mode; and a second set of separate masses disposed on at least one major surface of the free ends of the tuning fork arms at the middle portions thereof at positions corresponding to nodal points of the fundamental torsional mode and having a mass value effective to set the frequency-temperature characteristic of the fundamental flexural mode to a desired value.

7. A tuning fork resonator according to claim 6; wherein the first and second sets of masses are disposed on both major surfaces of the tuning fork arms.

8. A tuning fork resonator according to claim 6; wherein the first set of masses comprises one mass disposed at the inner edge portion and another mass disposed at the outer edge portion of each tuning fork arm.

9. A tuning fork resonator according to claim 8; wherein the second set of masses comprises a mass disposed at the middle portion of each tuning fork arm in spaced relation from the masses of the first set.

10. A tuning fork resonator according to claim 9; further including a third set of masses disposed on at least one major surface of the tuning fork arms along the length thereof between the fixed and free ends.

11. A tuning fork resonator according to claim 10; wherein the third set of masses comprises one mass disposed along the inner edge portion and another mass disposed along the outer edge portion of each tuning fork arm at positions where the frequency deviations of the fundamental flexural mode and the fundamental torsional mode are substantially equal.

12. A tuning fork resonator according to claim 10; wherein the third set of masses comprises a mass disposed at the middle portion of each tuning fork arm at a position corresponding to a nodal point of the fundamental torsional mode.

13. A tuning fork resonator according to claim 6; further including a third set of masses disposed on at least one major surface of the tuning fork arms along the length thereof between the fixed and free ends.

14. A tuning fork resonator according to claim 13; wherein the third set of masses comprises one mass disposed along the inner edge portion and another mass disposed along the outer edge portion of each tuning fork arm at positions where the frequency deviations of the fundamental flexural mode and the fundamental torsional mode are substantially equal.

15. A tuning fork resonator according to claim 14; wherein the third set of masses comprises a mass disposed at the middle portion of each tuning fork arm at a position corresponding to a nodal point of the fundamental torsional mode.

16. A tuning fork resonator according to claim 15; wherein the tuning fork body and tuning fork arms comprise a single piece of piezoelectric material.

17. A tuning fork resonator according to claim 16; wherein the piezoelectric material comprises quartz crystal.

18. A tuning fork resonator according to claim 6; wherein the tuning fork body and tuning fork arms comprise a single piece of piezoelectric material.

19. A tuning fork resonator according to claim 18; wherein the piezoelectric material comprises quartz crystal.

* * * * *